United States Patent [19]

Hutch

[11] Patent Number: 5,351,009
[45] Date of Patent: Sep. 27, 1994

[54] METHOD FOR CALIBRATING COMPONENTS PERMITTING THE USE OF LOW COST COMPONENTS

[75] Inventor: Frederick S. Hutch, Pipersville, Pa.

[73] Assignee: Honeywell, Inc., Minneapolis, Minn.

[21] Appl. No.: 27,993

[22] Filed: Mar. 8, 1993

[51] Int. Cl.$^5$ .............................. G01R 27/00
[52] U.S. Cl. .................... 324/601; 324/600; 324/691; 324/713; 73/1 R
[58] Field of Search ............... 324/601, 691, 713; 73/1 R

[56] References Cited

U.S. PATENT DOCUMENTS

| | | | |
|---|---|---|---|
| 4,081,744 | 3/1978 | Ray | 324/601 |
| 4,335,349 | 6/1982 | Baldock et al. | 324/705 X |
| 4,608,657 | 8/1986 | Manome et al. | 324/601 X |
| 4,663,586 | 5/1987 | Swerlein et al. | 324/601 X |
| 4,734,873 | 3/1988 | Malloy et al. | 73/1 R |
| 4,795,963 | 1/1989 | Ueno et al. | 324/601 |
| 4,841,229 | 6/1989 | Eccleston | 324/601 |

Primary Examiner—Kenneth A. Wieder
Assistant Examiner—Glenn W. Brown
Attorney, Agent, or Firm—Arthur A. Sapelli; A. Medved; W. Udseth

[57] ABSTRACT

Low cost components of a circuit board are calibrated in a test fixture to the same accuracy as a single high precision resistor, thereby eliminating the need for high precision, high cost components. The current through the resistor on the circuit board under test is ascertained by determining the current through the resistor by measuring the voltage of the high precision resistor. The voltage across the resistor under test is measured by a controller on the circuit board, thereby being able to calculate a high accuracy value for the resistor. The digital to analog converter (DAC) on the circuit board is calibrated by placing digital load values, or inputs, to the DAC and measuring the voltage across the corresponding calibrated resistors. Two values of inputs are used which define a line thereby calibrating the DAC.

6 Claims, 4 Drawing Sheets

METHOD FOR CALIBRATING COMPONENTS PERMITTING THE USE OF LOW COST COMPONENTS

BACKGROUND OF THE INVENTION

The present invention relates to a calibration technique, and more particularly, to a method for calibrating components on a circuit board which permits the use of low cost components.

A process control system (which controls a process by opening/closing valves, increasing/decreasing temperature to a vat containing a mixture, and similar types of control actions), controls an output from the process. More specifically, the control is via control signals from input/output circuit boards, including such types having an analog output current between 4 to 20 milliamps (ma) which has been established by industry standards. In order to insure some reasonable accuracy of the output current of the analog output circuit board, precision components need to be used, thus resulting in an increased cost of the analog output circuit board.

In order to reduce the requirement and dependency on high cost components in an attempt to reduce the cost of the analog output circuit board (referred to herein as circuit board), low precision components are utilized on a new analog output circuit board (referred to herein as new circuit board). The low precision components have a greater tolerance and are the low cost components.

In order for the new circuit board to have the same accuracy as the circuit board, the low cost components need to be calibrated. Thus there is a need to have a method in which the low cost components of the new circuit board can be calibrated.

SUMMARY OF THE INVENTION

Therefore, there is provided by the present invention, a method for calibrating low cost components of an analog output circuit board. The components include at least one digital to analog converter (DAC) and a corresponding low accuracy DAC resistor for each DAC. Each DAC resistor is connected to a corresponding output terminal. The circuit board interfaces with a test fixture having a precision test resistor, all DACs being connected to the same precision test resistor. The circuit board further includes a controller for controlling the calibration method.

The DACs are first calibrated by loading a predetermined DAC with a first load value, the first load value initially corresponding to an nominal value of a first predetermined current. A resistor voltage value across the shared precision resistor of the factory fixture is read, and a DAC current value being outputted from the DAC using the value of the shared precision resistor is calculated. If the DAC current value equal the first predetermined current, the first load value is saved. Otherwise, the first load value is modified the process is repeated. When all the DACs have been processed to determined each first load value, which corresponds to a first predetermined count value, the method is repeated utilizing a second load value to a determined second predetermined count value. A line is thereby defined such that for any value of DAC output current desired, a count value to be loaded into the DAC can be calculated, for each DAC, thus calibrating the DAC. The DAC measuring resistors are next calibrated. The method comprises the steps of loading a predetermined DAC with a load value corresponding to a nominal predetermined current, and a voltage value across the precision test resistor is read. If the voltage value has a first predetermined value an indication is given to the controller that the first predetermined value has been obtained. Otherwise, an indication is given that the first predetermined value has not been obtained. The load value is modified and the load value as modified is loaded into the predetermined DAC, and the measurement is repeated. A resistance value is then calculated for the DAC measuring resistor corresponding to the predetermined DAC. The resistor value calculated from above is stored for each DAC and the method is repeated for a next DAC until all the DAC resistors have been calibrated, each resistor value having the same accuracy as the accuracy of the precision test resistor.

Accordingly, it is an object of the present invention to provide a method for calibrating components of an analog output circuit board.

It is another object of the present invention to provide a method for calibrating components of an analog output circuit board which permits the use of low cost components.

These and other objects of the present invention will become more apparent when taken in conjunction with the following description and attached drawings, wherein like characters indicate like parts, and which drawings form a part of the present application.

DETAILED DESCRIPTION

Figure 1:
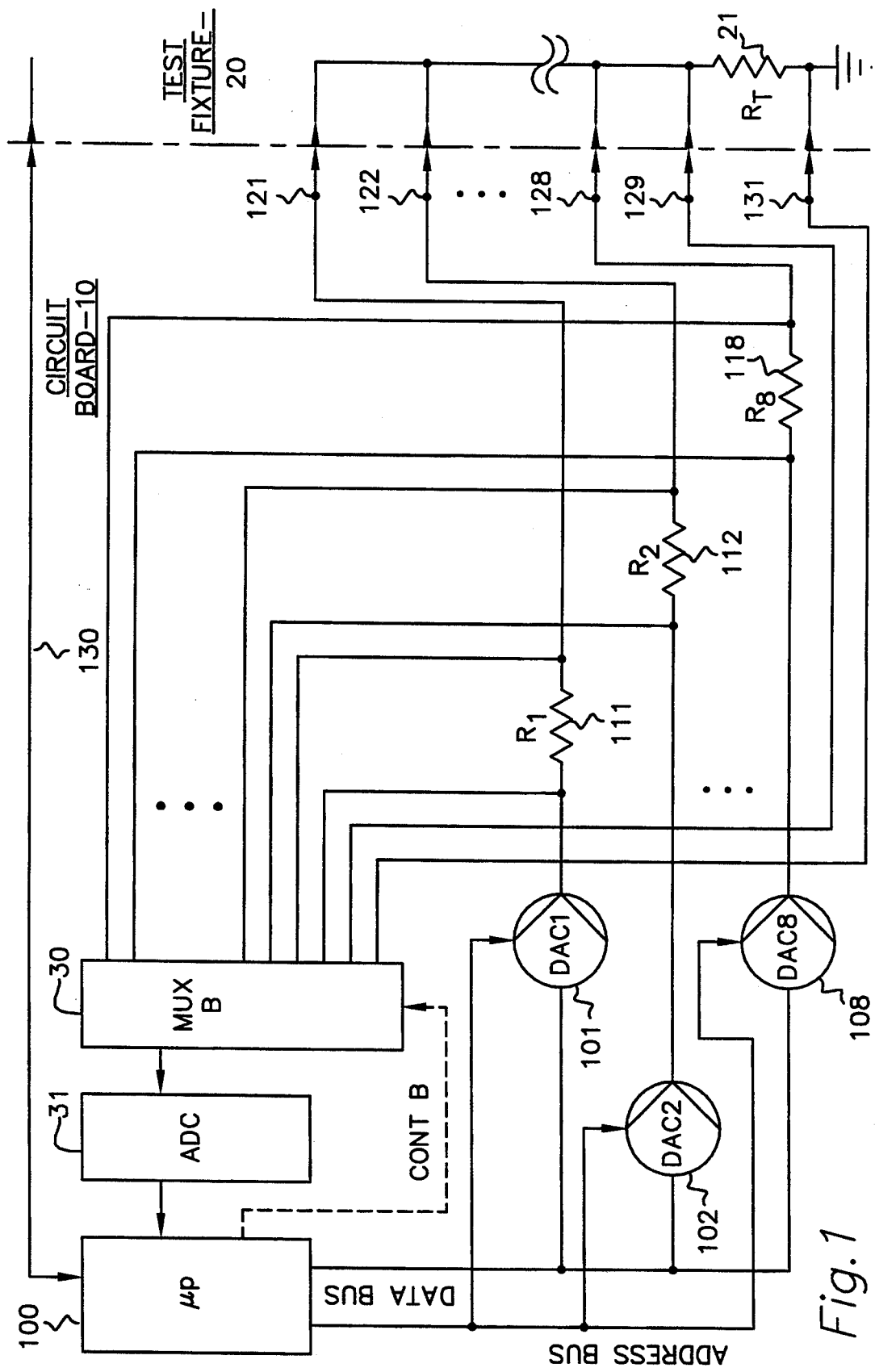
FIG. 1 shows a partial block diagram of a circuit board of the preferred embodiment of the present invention.

Referring to FIG. 1, there is shown a partial block diagram of a circuit board 10 of the preferred embodiment of the present invention. The circuit board 10 is an analog output driver having eight (8) individual output driver circuits (or 8 output channels), although it will be obvious to one skilled in the art any number of output channels can be used. Each output channel includes a digital-to-analog converter (DAC1, DAC2, . . . , DAC8) 101, 102, . . . , 108. Each DAC is loaded with a corresponding digital quantity by a microprocessor ($\mu$p) 100. Each digital value is converted to a corresponding analog value by the corresponding DAC, which outputs that analog signal to a field device (not shown), such as a valve, . . . attached to a corresponding output terminal 121, 122, . . . , 128. Also included are eight measuring resistors ($R_1, R_2, \ldots R_8$) 111, 112, 118, each resistor being associated with a corresponding output channel. Since the cost of eight precision measuring resistors $R_1, R_2, \ldots R_8$ is very high, the method of the preferred embodiment of the present invention, which permits the use of low precision resistors of extremely low cost to be used, will now be described.

At the factory, the analog output circuit board 10 is inserted into a test fixture 20 having a single high precision test resistor, $R_T$, 21 such that all eight output terminals 121, 122, . . . , 128 are connected to the test resistor 21. The test resistor 21 includes a volt meter across the resistor (not shown) as part of the test fixture. Further, there exists a connection 130 which provides an interface between the operator/test fixture 20 and the circuit board 10. (This link may be directly from the test fixture 20 or via some other logic on the circuit board 10, or any number of input paths for communicating to the microprocessor including the invention of the factory test mode.)

Figure 2:
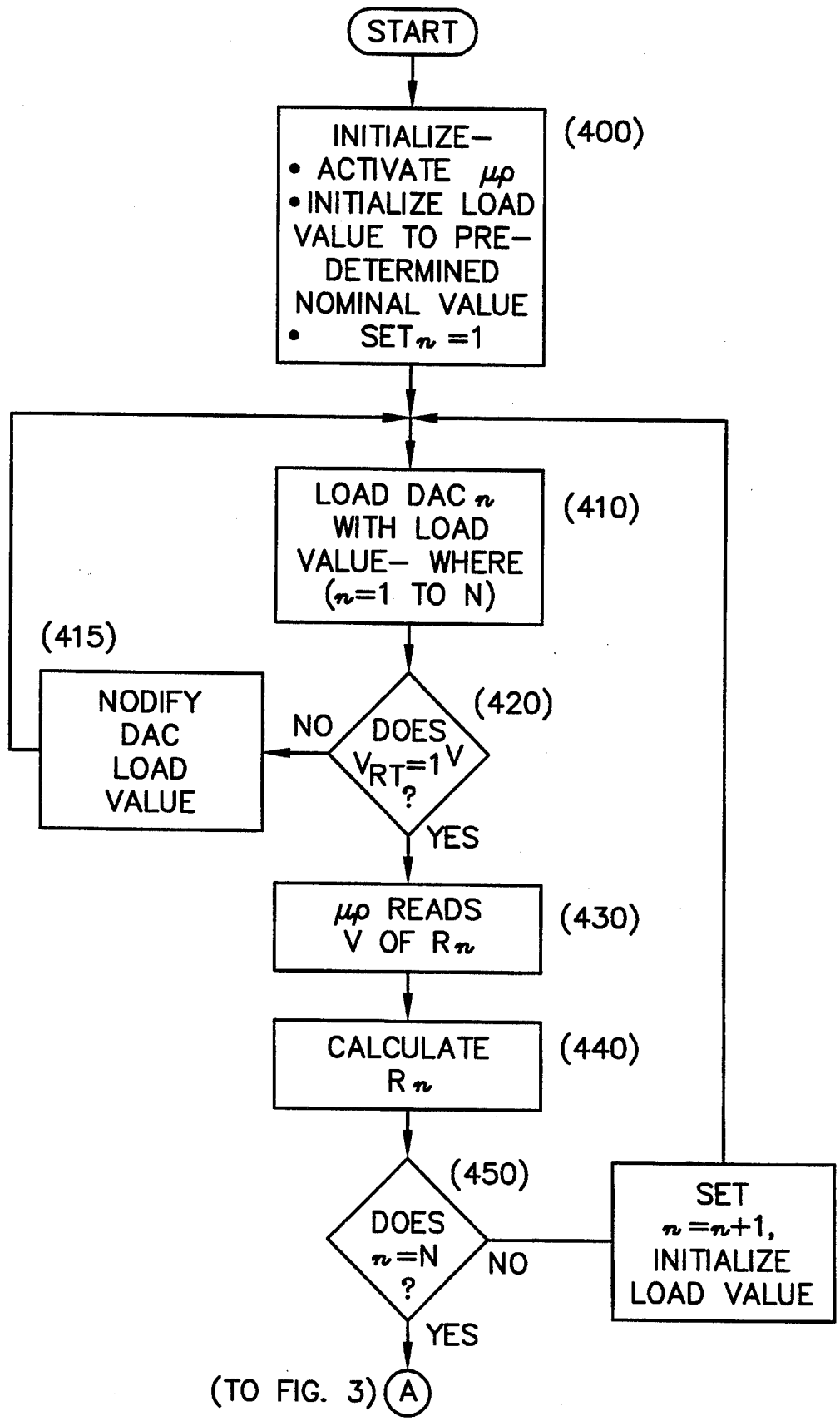
FIGS. 2 and 3 show a functional flow diagram of the method of the present invention for providing a calibration test of the circuit board.

Referring to FIG. 2 there is shown a flow diagram of the method of the present invention for providing the calibration test, and in conjunction with FIG. 1, the method will now be described. The operator activates the microprocessor 100 to initiate the test mode via the interface connection 130 (block 400). (It will be recognized by those skilled in the art that the test can be loaded from some memory or logic from the test fixture to the microprocessor, can be stored within the microprocessor, . . . . It is not necessary for an understanding of the method of the present invention to understand how the microprocessor is initiated or loaded, but will be well understood by those skilled in the art that the microprocessor can initiate the test sequence to be described below.)

Figure 3:
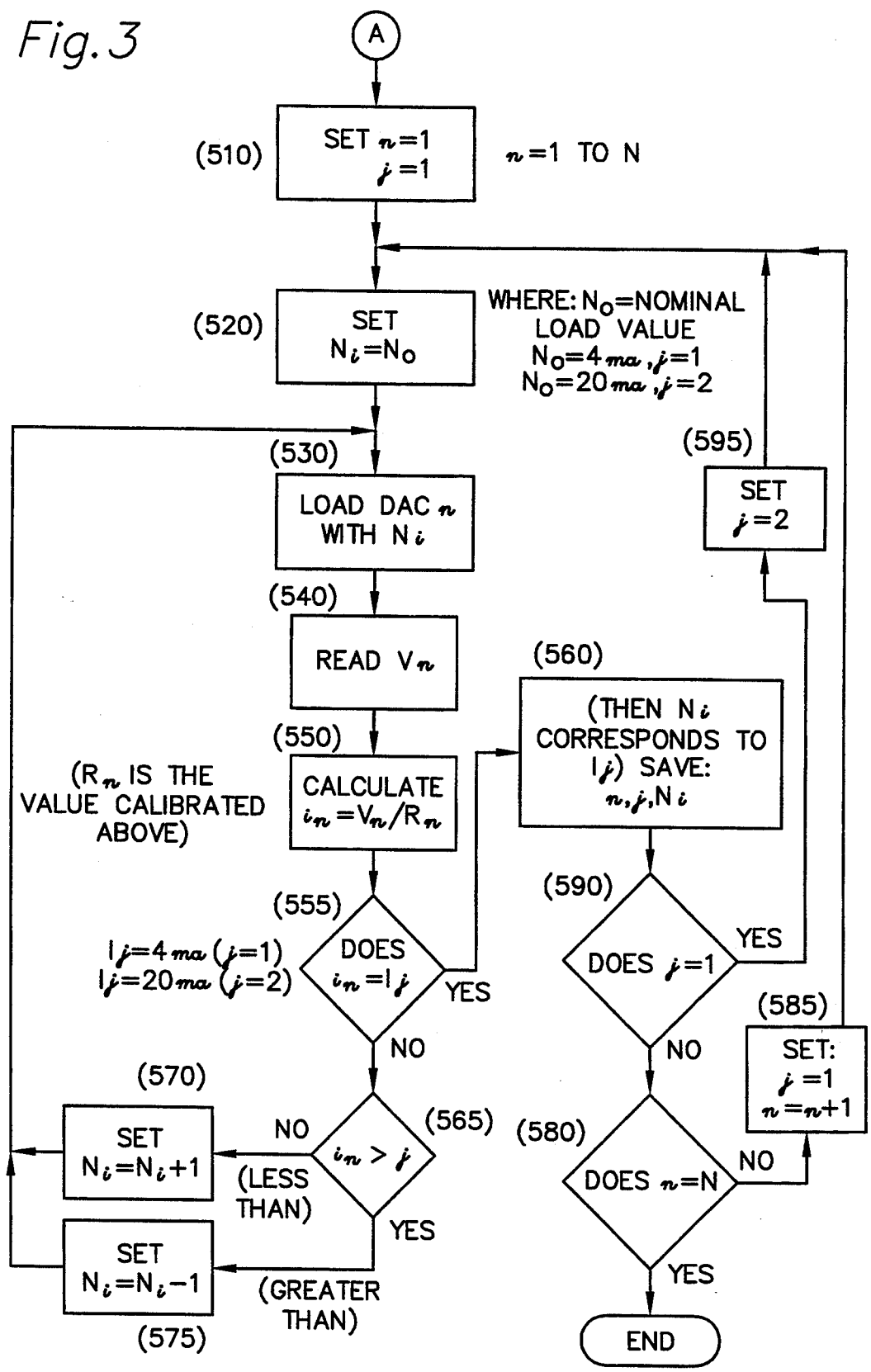

In order to calibrate the circuit board 10, each digital to analog converter (DAC) 101, 102, . . . 108 must first be calibrated. Referring to FIG. 3 the calibration sequence starts and is shown by the functional flow diagram. Since each DAC has a tolerance of about 10 percent, the DAC must be calibrated. The first DAC 1 101 (wherein n equals 1) is calibrated first (block 510). The microprocessor loads a nominal load value into the DAC, the nominal load value being a digital count which corresponds to a nominal 4 ma (block 520). This quantity is loaded into the DAC via the microprocessor 100 via address 28 and data bus 29. The quantity loaded into the DAC 101 is converted to an analog current which flows through resistor R 1 and the circuit is completed by $R_T$ via the terminal 129 and 131 back to multiplexer B 30 (MUXB) back to the µp 100. MUXB 30 is under control of the microprocessor 100 via a control signal CONTB. The voltage developed on $R_T$ is read by the microprocessor via MUXB 30 and ADC 31, the microprocessor obtaining an accurate value of the current outputted by the DAC 101. If $i_1$ equals 4 ma (block 555) then the digital count loaded into the DAC 101 corresponds to 4 ma and the value of the count $N_1$ is saved (block 560). If the value of the current $i_1$ does not equal 4 ma (block 555) then a determination is made if the current is greater then or less then 4 ma (block 565). If the value of the current $i_1$ is less than 4 ma, the digital count is increased by one (block 570) and the value is loaded into the DAC 1 and the calculation repeated (block 530). If the value of the current is greater the 4 ma, then the count is decreased by one (block 575) and the process repeated (block 530). The process is repeated for all the DACs (block 580, 585), and the process is repeated for each DAC for a value of 20 ma for the upper bound of the current outputted by the DACs (block 590, 595).

Figure 4:
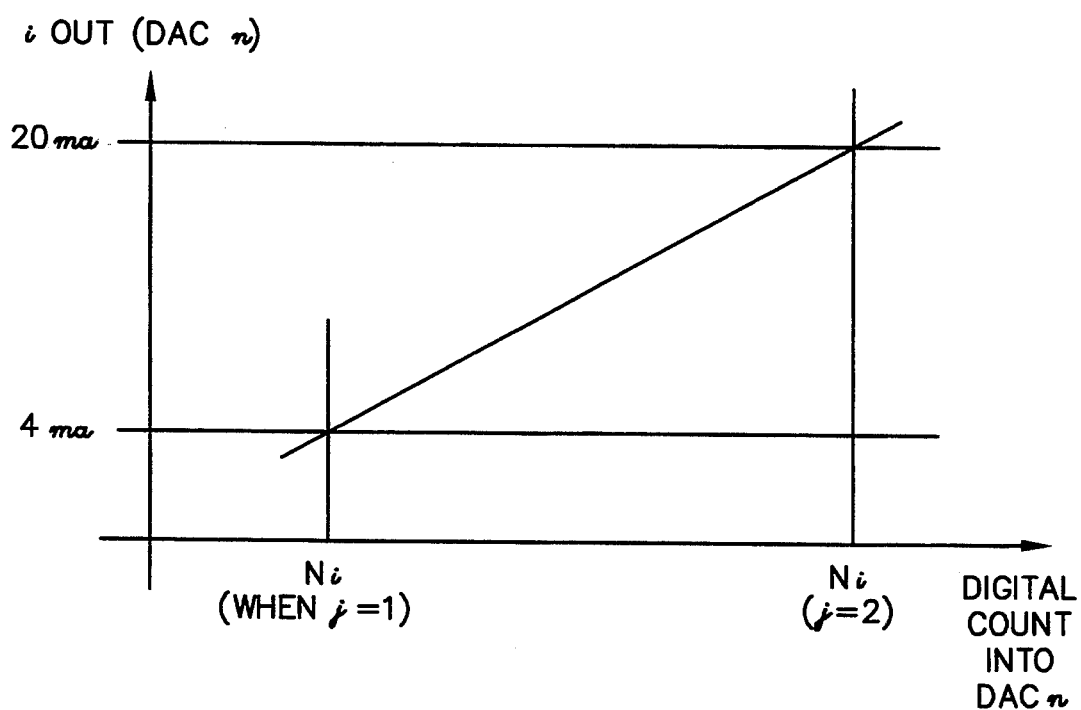
FIG. 4 shows the data gathered of the calibration test of FIG. 3 and how the data relates to the calibration.

Referring to FIG. 4 the DACs have now been calibrated. The digital count of 4 ma and the digital count at 20 ma define two unique points. Those points define a line having a slope and an intercept point of the line utilizing a digital count on the abscissa and the output current of the DAC, on the ordinate axis. Knowing the values which define the line corresponding to the actual DAC, the desired current output from the DAC, the count to be loaded into the DAC can be calculated by standard interpolation techniques well known to one skilled in the art. To complete calibration, $R_1 \ldots R_8$ are next calibrated. Once the DACs are calibrated, the resistors 111, 112, . . . 118 can then be calibrated by loading the first DAC DAC1 101 with the predetermined value which results in a predetermined current, in the preferred embodiment the predetermined current being 4 ma, the voltage across resistor $R_1$ 111 is read via MUXB 30 and ADC 31. A calculation of the voltage just read divided by 4 ma will give the resistance value of $R_1$. All the remaining resistors $R_2, \ldots R_8$ can also be determined in a like fashion.

Alternatively, the resistors $R_1 \ldots R_8$ can be calibrated in accordance with the method to be now described. The microprocessor 100 applies a predetermined numerical value to the digital to analog converter 1 (DAC 1) 101 via the microprocessor addresses and data bus. The predetermined numerical value loaded into the DAC 1 101 corresponds to a nominal analog output value of 4 ma (block 410). The value of the test resistor 21 is 250 ohms±0.01% in the preferred embodiment of the present invention. This part is taken to have essentially zero error for all following discussion. If the value of the voltage across $R_T$ is less than 1 volt, an indication is made to the microprocessor 100 (by the operator) such that the numeral value of the predetermined digital quantity to the DAC 1 101 is increased. (Similarly, if the voltage reading across $R_T$ were too high, the numeral value to the DAC 1 is reduced) (block 415.) When the voltage reading is exactly 1 volt, the operator indicates such to the microprocessor 100 again via interface connection 130. At this point the current through the test resistor 21 is exactly 4 ma+/−. At this point the microprocessor is notified to read the value of the voltage across resistor 1 $R_1$ via a multiplexer B (MUXB) 30 and an analog to digital converter 31 (block 430). The MUXB 30 is under control of the microprocessor 100 via a control signal CONTB. Knowing the value of the voltage reading across $R_1$ ($V_{R1}$), and knowing the current value to be exactly 4 ma (+/−0.00X), where (0.00X) is the tolerance of the resistor $R_T$, the value of resistor $R_1$ is determined by:

$$R_1 = \frac{V_{R1}}{4ma} \text{ (block 440).}$$

The value of the resistor $R_1$ 111 is stored in a nonvolatile memory (not shown) of the circuit board 10 associated with the microprocessor 100, and is thereby the calibration value of $R_1$. The microprocessor then repeats the above procedure for $R_2$ 112, . . . , until all the resistors of the circuit board 10 have been calibrated (block 450). Thus it can be seen that all the resistors on the circuit board 10 can be calibrated to the same accuracy as the single high cost resistor of the test fixture. If the circuit board 10 is not to be calibrated frequently, then the resistors $R_1$ through $R_8$ should be of a type which are relatively stable. Thus low accuracy, high stability measuring resistors may be required which is usual for this type of part.

It will be understood by those skilled in the art that the interface between the operator/test fixture 20 and the circuit board 10 can be automated to substantially reduce the role of the operator. The preferred embodiment first calibrates ADC (31) with a voltage calibrator at 129 and 131, the up by itself determines if the voltage on $R_T$ is above or below the goal.

Thus the components on the circuit board 10 can include low cost DAC and low cost resistors and still achieve a very precise output current.

It will be recognized by those skilled in the art that the DACs but not $R_1 \ldots R_8$ can be calibrated in the field without the use of the test fixture 20 since no operator actions are required during the course of the test and the output terminals 121, 122, ... 128 can be connected by a jumper wire to terminal 129 and 131.

While there has been shown what is considered the preferred embodiment of the present invention, it will be manifest that many changes and modifications can be made therein without departing from the essential spirit and scope of the invention. It is intended, therefore, in the annexed claims to cover all such changes and modifications which fall within the true scope of the invention.

I claim:

1. A method for calibrating components on a circuit board, said components including at least one digital to analog converter (DAC) and a corresponding DAC resistor for each DAC, each DAC resistor being connected to a corresponding output terminal, the circuit board interfacing with a test fixture having a precision test resistor, each output terminal being connected to the same precision test resistor, the circuit board further including a controller for controlling the calibration method, the method comprising the steps of:
   a) loading a predetermined DAC with a corresponding first load value, the first load value initially corresponding to a nominal value of a corresponding first predetermined current;
   b) reading a resistor voltage value across the precision resistor of the test fixture;
   c) calculating a DAC current value being outputted from the DAC using the value of the precision resistor and the resistor voltage value read in step (b);
   d) if the DAC current value equals the first predetermined current,
      i) saving the first load value; otherwise
      ii) modifying the first load value and proceed
   e) when all the DACs have been processed to determined each corresponding first load value, which corresponds to a corresponding, first predetermined count value for each respective DAC, repeating the method at step (a) utilizing a corresponding second load value to determine a corresponding second predetermined count value, thereby defining a line for each respective DAC such that for any value of DAC output current desired from a predetermined DAC a count value to be loaded into the predetermined DAC can be calculated for the preselected DAC, thus calibrating each DAC.

2. A method for calibrating components on a circuit board according to claim 1 further comprising the steps of:
   A) loading a predetermined DAC with a load value corresponding to a predetermined current;
   B) reading a voltage value across the corresponding DAC resistor;
   C) calculating a resistor value for the resistor corresponding to the predetermined DAC;
   D) storing the resistor value calculated from step (C); and
   E) repeating the method at step (A) for a next DAC until all the DAC resistors have been calibrated, each resistor value having the same accuracy as the accuracy of the precision test resistor.

3. A method for calibrating components on a circuit board according to claim 1 further comprising the steps of:
   A) loading a predetermined DAC with a load value corresponding to a known predetermined current value;
   B) reading a voltage value across the resistor corresponding to the predetermined DAC; and
   C) calculating the resistor value for the resistor corresponding to the predetermined DAC utilizing the voltage read in step (B) and the known predetermined current value.

4. A method for calibrating components on a circuit board, said components including at least one digital to analog converter (DAC) and a corresponding resistor for each DAC, each resistor being connected to a corresponding output terminal, the circuit board interfacing with a test fixture having a precision test resistor, each output terminal being connected to the precision test resistor, the circuit board further including a controller for controlling the calibration method, the method comprising the steps of:
   a) loading a predetermined DAC with a load value corresponding to a predetermined current;
   b) reading a voltage value across the corresponding DAC resistor;
   c) calculating a resistor value for the resistor corresponding to the predetermined DAC;
   d) storing the resistor value calculated from step (c); and
   e) repeating the method at step (a) for a next DAC until all the DAC resistors have been calibrated, each resistor value having the same accuracy as the accuracy of the precision test resistor.

5. A method for calibrating components on a circuit board according to claim 4 further comprising the steps of:
   A) loading a predetermined DAC with a first load value, the first load value initially corresponding to a value of a first predetermined current;
   B) reading a resistor voltage value across the corresponding resistor of the DAC;
   C) calculating a DAC current value being outputted from the DAC using the stored value of the corresponding resistor;
   D) if the DAC current value equal the first predetermined current,
      i) saving the first load value stored in the DAC under test; otherwise
      ii) modifying the first load value and proceeding to step (A);
   E) when all the DACs have been processed to determined each corresponding first load value, which corresponds to a corresponding first predetermined count value for each respective DAC, repeating the method at step (A) utilizing a corresponding second load value to determine a second corresponding predetermined count value, thereby defining a line for each respective DAC such that for any value of DAC output current desired from a predetermined count value to be loaded into the predetermined DAC can be calculated for the preselected DAC, thus calibrating each DAC.

6. A method for calibrating components on a circuit board, said components including at least one digital to analog converter (DAC) and a corresponding resistor for each DAC, each resistor being connected to a corresponding output terminal, a precision value of each resistor being stored on the circuit board, the circuit board further having a test output terminal for completing the circuit to each DAC, the circuit board further including a controller for controlling the calibration method, the method comprising the steps of:

a) connecting each output terminal to the test output terminal;

b) loading a predetermined DAC with a first load value, the first load value initially corresponding to a nominal value of a first predetermined current;

c) reading a voltage value across the corresponding resistor of the DAC;

d) calculating a DAC current value being outputted from the DAC using the stored value of the corresponding resistor;

e) if the DAC current value equals the first predetermined current,
  i) saving the first load value; otherwise
  ii) modifying the first load value and proceeding to step (a);

f) when all the DACs have been processed to determined each corresponding first load value, which corresponds to a corresponding first predetermined count value for each respective DAC, repeating the method at step (a) utilizing a corresponding second load value to determine a corresponding second predetermined count value, thereby defining a line for each respective DAC such that for any value of DAC output current desired from a predetermined DAC a count value to be loaded into a predetermined DAC can be calculated for the preselected DAC, thus calibrating each DAC.

* * * * *